(12) United States Patent
Bartos et al.

(10) Patent No.: US 11,614,500 B2
(45) Date of Patent: Mar. 28, 2023

(54) INTEGRATED MAGNETOMETER AND METHOD OF DETECTING A MAGNETIC FIELD

(71) Applicant: TE Connectivity Germany GmbH, Bensheim (DE)

(72) Inventors: Axel Bartos, Dortmund (DE); Armin Meisenberg, Dortmund (DE)

(73) Assignee: TE Connectivity Germany GmbH, Bensheim (DE)

( * ) Notice: Subject to any disclaimer, the term of this patent is extended or adjusted under 35 U.S.C. 154(b) by 11 days.

(21) Appl. No.: 17/202,869

(22) Filed: Mar. 16, 2021

(65) Prior Publication Data
US 2021/0293903 A1   Sep. 23, 2021

(30) Foreign Application Priority Data
Mar. 18, 2020   (EP) .................................... 20163834

(51) Int. Cl.
 *G01R 33/02* (2006.01)
 *G01R 33/09* (2006.01)
(52) U.S. Cl.
 CPC ......... *G01R 33/0206* (2013.01); *G01R 33/09* (2013.01)
(58) Field of Classification Search
 CPC .......................... G01R 33/0206; G01R 33/09
 See application file for complete search history.

(56) References Cited

U.S. PATENT DOCUMENTS

| | | | |
|---|---|---|---|
| 5,719,494 A | 2/1998 | Dettmann et al. | |
| 5,910,774 A * | 6/1999 | Capriotti | G01R 22/066 340/657 |
| 7,501,815 B2 * | 3/2009 | Brunson | G01R 33/0283 33/355 R |
| 9,104,922 B2 * | 8/2015 | Pant | G01R 33/09 |
| 10,008,064 B2 * | 6/2018 | Meisenberg | G01R 15/20 |
| 2007/0257669 A1 | 11/2007 | Delevoye et al. | |
| 2013/0334634 A1 | 12/2013 | Deak et al. | |
| 2017/0168123 A1 | 6/2017 | Kandori et al. | |
| 2018/0335294 A1 | 11/2018 | Ausserlechner | |
| 2020/0003848 A1 | 1/2020 | Snoeij et al. | |

FOREIGN PATENT DOCUMENTS

| | | |
|---|---|---|
| EP | 3133561 A1 | 2/2017 |
| EP | 3457155 A1 | 3/2019 |
| WO | 2014146570 A1 | 9/2014 |

OTHER PUBLICATIONS

Extended European Search Report, European Application No. 20163834.3-1010, European Filing Date, Oct. 2, 2020.

* cited by examiner

*Primary Examiner* — Walter L Lindsay, Jr.
*Assistant Examiner* — Milton Gonzalez
(74) *Attorney, Agent, or Firm* — Barley Snyder

(57) ABSTRACT

An integrated magnetometer comprises at least one field sensor unit including a first transducer element for generating, in response to a detected magnetic field, a first electrical output signal. At least one gradient sensor unit of the magnetometer includes at least a pair of second transducer elements which are arranged to detect the magnetic field at two different locations and generate, in response to the detected magnetic field, a second electrical output signal. The first and second transducer elements are formed on a common substrate and are encompassed by a common protective layer and/or housing.

20 Claims, 8 Drawing Sheets

INTEGRATED MAGNETOMETER AND METHOD OF DETECTING A MAGNETIC FIELD

CROSS-REFERENCE TO RELATED APPLICATIONS

This application claims priority under 35 U.S.C. § 119 to European Patent Application No. 20163834.3, filed on Mar. 18, 2020.

FIELD OF THE INVENTION

The present invention relates to an integrated magnetometer, and more particularly, to a sensor for detecting ferro- or superparamagnetic structures on material surfaces.

BACKGROUND

Highly sensitive magnetometers are used to detect the very weak magnetic material contained in some magnetic security features of a banknote when preforming security checks of the note. These security features may comprise magnetic pigments in the printing color pigments, but also metallized safety threads, or other specifically designed magnetic features. Due to their high sensitivity and low noise, anisotropic magnetoresistance (AMR) sensors may be used for this purpose. However, the electrical signals generated are still very weak.

In the past, banknote line sensor arrays had a reading width of approximately 10 mm per channel. However, recent efforts are being made to increase the resolution in order to be able to resolve more magnetic details on the banknotes. Smaller magnetic security features are expected due to the increasing number of counterfeit banknotes and improved note quality among counterfeiters. With a higher resolution of the magnetic image of a banknote, the verification of the features must increase in accuracy. For example, a banknote validator system may require 112 channels with a total scan length of 196 mm. This corresponds to a resolution of 1.75 mm per channel.

Generally, magnetoresistive sensors (also referred to herein as magnetic sensors) measure the direction and intensity of magnetic fields. Such arrangements are used to identify magnetic materials such as magnetic markings in banknotes, as well as to detect angles and positions by means of magnetometers. The sensors make use of the magnetoresistive effect, which is the tendency of a material (e.g., ferromagnetic) to change the value of its electrical resistance in an externally applied magnetic field. In particular, in multicomponent or multilayer systems, giant magnetoresistance (GMR), tunnel magnetoresistance (TMR), colossal magnetoresistance (CMR), and extraordinary magnetoresistance (EMR) are observed, while the anisotropic magnetoresistive effect (AMR) needs only one layer to occur.

Magnetic sensors provide high accuracy and robustness against challenging environmental conditions and play an important role in various applications such as manufacturing and transportation applications. In more detail, sensors based on a magnetoresistance effect are important components because of their low intrinsic measurement error and high stability. Additionally, the favorable temperature characteristic as well as the robustness against harsh environmental conditions leads to the relevance of magnetoresistive sensors in many important applications.

The strength of the magnetic field is usually described by the magnetic flux density B. The gradient of the magnetic flux density results from a change of B per unit distance along the direction of the greatest change of B. As B is a vector, which usually is also a function of all three spatial dimensions, the gradient is a tensor comprising all partial derivatives of the three spatial B-field components with respect to the spatial coordinates. In practice, for measuring the gradient two magnetic field sensors are used which measure the magnetic flux density at two different locations, separated by a well-defined distance. Then, the difference of the two measured flux density values is calculated and divided by the distance. The distance is chosen in a way that the B-field varies linearly within the distance, in other words, by choosing a distance that is small compared to the distance between each of the sensors and the magnetic field source.

When reading magnetic safety structures on documents such as banknotes with conventional magnetoresistive sensor arrays, it is known to either detect the intensity of the magnetic field as an absolute value or to detect a local field gradient. For each technology there exist different sensor designs. Specifically, field sensors which detect the absolute intensity of the magnetic field have the advantage of a high sensitivity especially over higher distances. However, field sensors have the disadvantage that their output signal may be impaired by external disturbing magnetic fields. On the other hand, gradient sensors preform a differential measurement and are therefore insensitive to external disturbing magnetic fields. However, gradient sensors have the disadvantage of a much lower sensitivity compared to field sensors, in particular for larger distances from the magnetic objects to be detected.

Accordingly, there is a need for a magnetic sensor suitable for banknote sensing which avoids the above drawbacks of both field and gradient sensors.

SUMMARY

In one embodiment of the present disclosure, an integrated magnetometer includes at least one field sensor unit having a first transducer element for generating, in response to a detected magnetic field, a first electrical output signal. At least one gradient sensor unit of the magnetometer includes at least a pair of second transducer elements which are arranged to detect the magnetic field at two different locations. The second transducer elements are adapted to generate, in response to the detected magnetic field, a second electrical output signal. The first and second transducer elements are formed on a common substrate and are encompassed by a common protective layer and/or housing.

BRIEF DESCRIPTION OF THE DRAWINGS

The invention will now be described by way of example with reference to the accompanying Figures, of which.

DETAILED DESCRIPTION OF THE EMBODIMENTS

Figure 1:
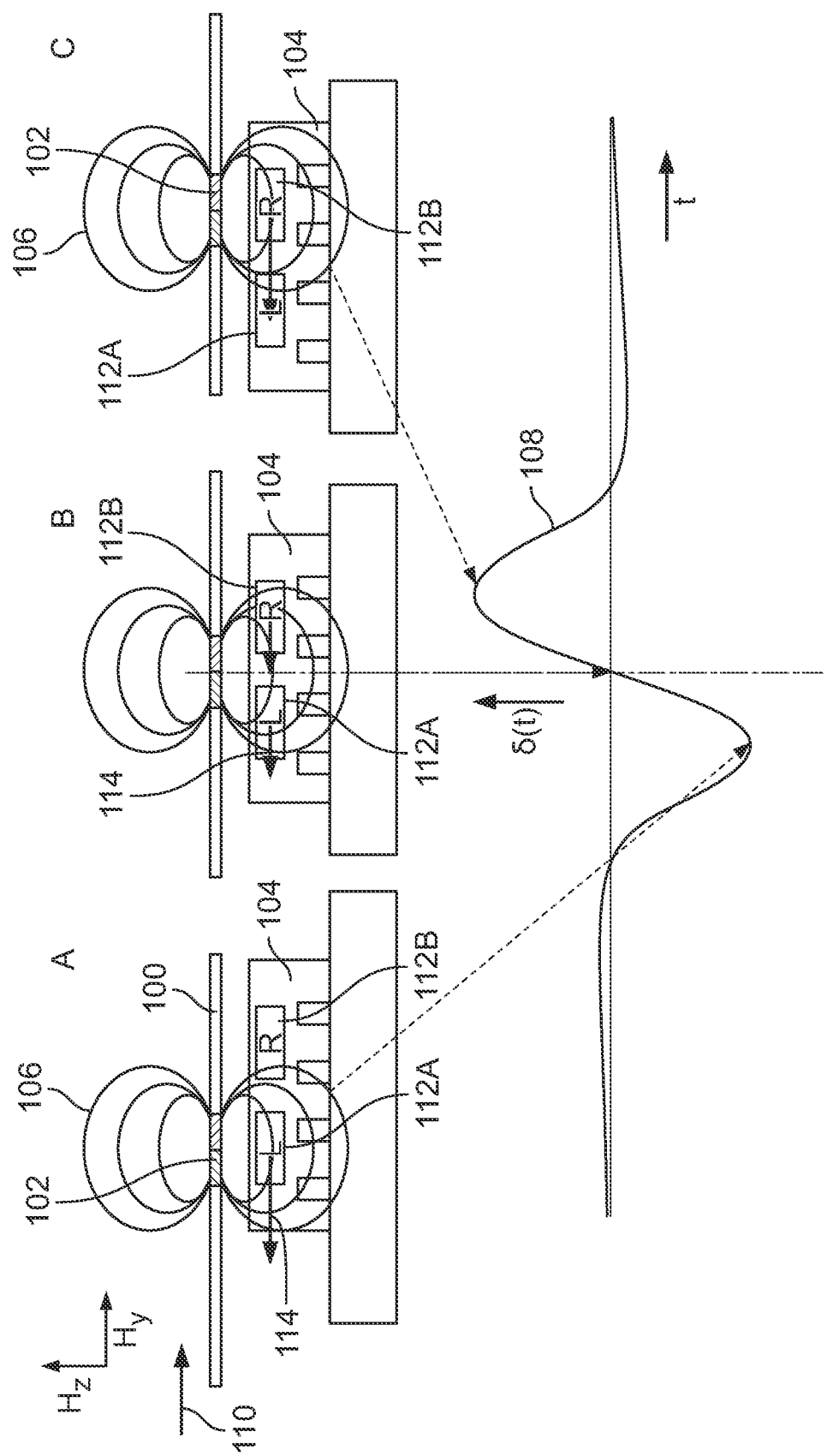
FIG. 1 is a schematic diagram illustrating the operation of a magnetic gradient sensor.

Technical solutions of the present disclosure will be described hereinafter in detail through embodiments and with reference to the attached drawings. In the specification, the same or the like reference numerals refer to the same or the like elements. The illustration of the embodiments of the present disclosure made with reference to the attached drawings is aimed to explain the general inventive concept of the present disclosure, not to be construed as a limitation of the present disclosure.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Referring to FIG. 1, a schematic diagram of the detection of a moving (ferro-) magnetic marking on a banknote by means of a magnetic gradient sensor is shown. In particular, a banknote 100 with a magnetic safety feature 102 moves with respect to a magnetic gradient sensor 104. The safety feature 102 is generally referred to as a magnetic field source with a north and south pole and magnetic flux lines 106. The magnetic source 102 may be attached to any other movable object for different measurement applications, for example, determination of a position. However, the following description is made in the context of a banknote authentication system as an example of how the integrated magnetometer according to the present invention works and can be used.

The diagram of FIG. 1 shows as a curve 108 the measurement signal δ as a function of the time t. In particular, δ(t) is the difference between the measurement values of two transducer elements 112A, 112B. Illustrations A, B, and C show respective positions of the magnetic source 102 with respect to the magnetic gradient sensor 104 at specific instants while the banknote 100 is moving in the direction of the arrow 110. Without loss of generality, this direction is assumed to be along the y-direction, whereas the banknote 100 is distanced or spaced apart from the magnetic gradient sensor 104 in the z-direction. The directions of the corresponding Cartesian magnetic field components $H_y$ and $H_z$ are schematically indicated in FIG. 1.

By way of example, the banknote 100 may be moving in the direction 110 with a velocity of 1 m/s to 10 m/s. The magnetic gradient sensor 104 has two transducer elements 112A, 112B. Each of the transducer elements 112A, 112B detects a magnetic flux in the y-direction. When the magnetic source 102 is in the position A shown in FIG. 1, a maximal difference is measured in the negative direction because only transducer element 112A, which is on the left side of the magnetic gradient sensor 104, measures a magnetic flux as indicated by arrow 114.

When the banknote 100 containing the magnetic source 102 moves further in the direction 110, the measurable magnetic flux for the left-hand transducer element 112A becomes smaller, whereas the measurable magnetic flux for the right-hand side transducer element 112B increases. Because the measurement signal δ(t) represents the difference between the signals of the two transducer elements 112A and 112B, the configuration for positon B, where the magnetic source 102 is symmetric with respect to the transducer elements 112A, 112B, results in a zero signal.

A further (positive) maximum of the curve 108 can be seen for position C, where the right-hand side transducer element 112B is in closest proximity to the magnetic source 102.

The advantage of such a gradient measurement is the fact that inherent to the differential measurement disturbing magnetic fields do not impair the accuracy of the measurement. However, the signal amplitude is lower than for magnetic field sensors which detect the absolute value of the flux density.

Figure 2:
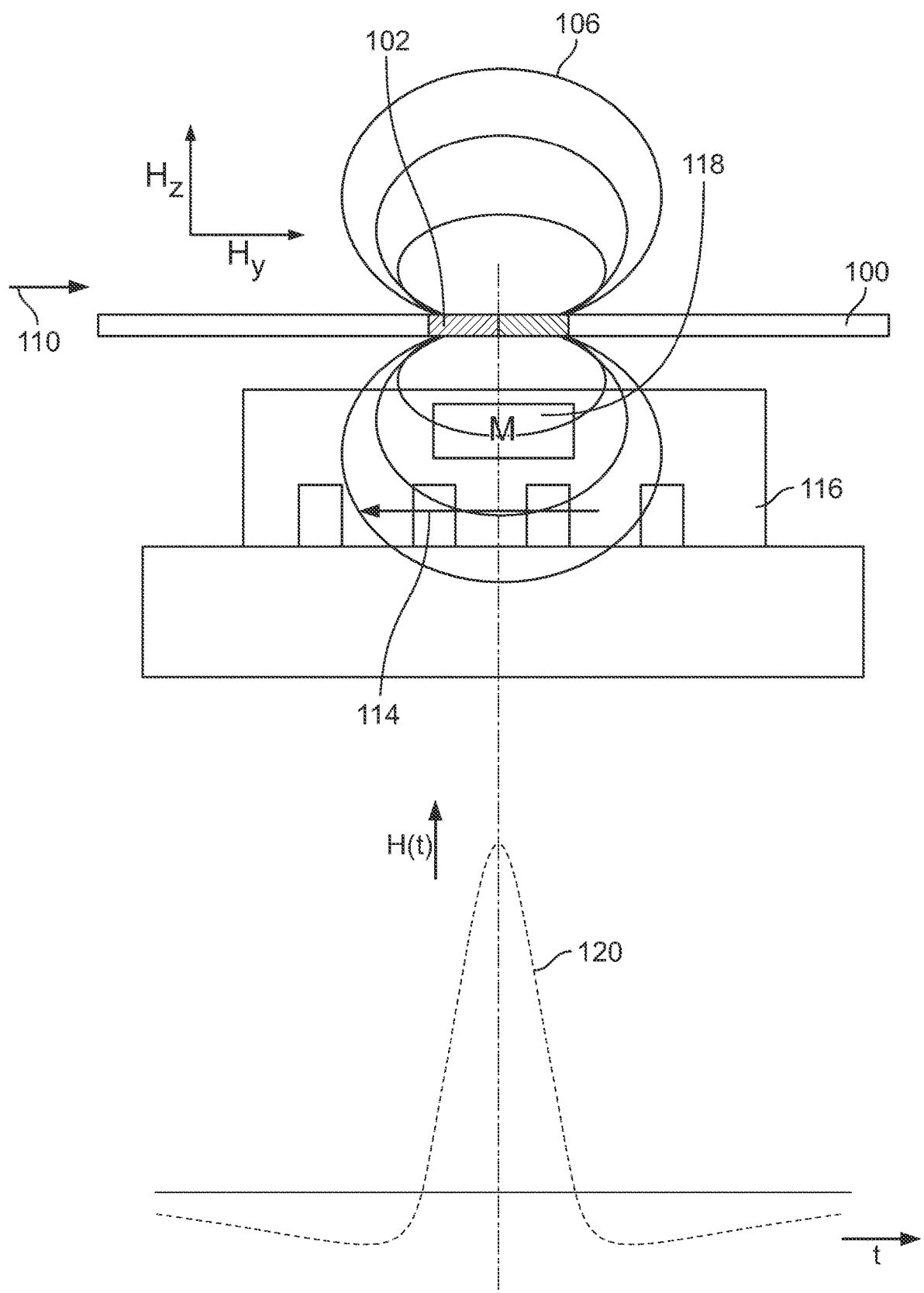
FIG. 2 is a schematic diagram illustrating the operation of a magnetic field sensor.

FIG. 2 illustrates a banknote authentication system, corresponding to the system shown in FIG. 1, having a magnetic field sensor 116 instead of the magnetic gradient sensor 104. The magnetic field sensor 116 has only one transducer element 118 which outputs a signal H(t) which is indicative of the absolute value of the magnetic flux in the y-direction. Curve 120 shows the progression of the signal with the time t while the banknote 100 is moving along the direction 110. As can be seen from the comparison with FIG. 1, the measurable signal amplitude is higher. However, a problem with magnetic field sensors is that they are sensitive towards disturbing magnetic fields which directly influence the measurement signal.

Figure 3:
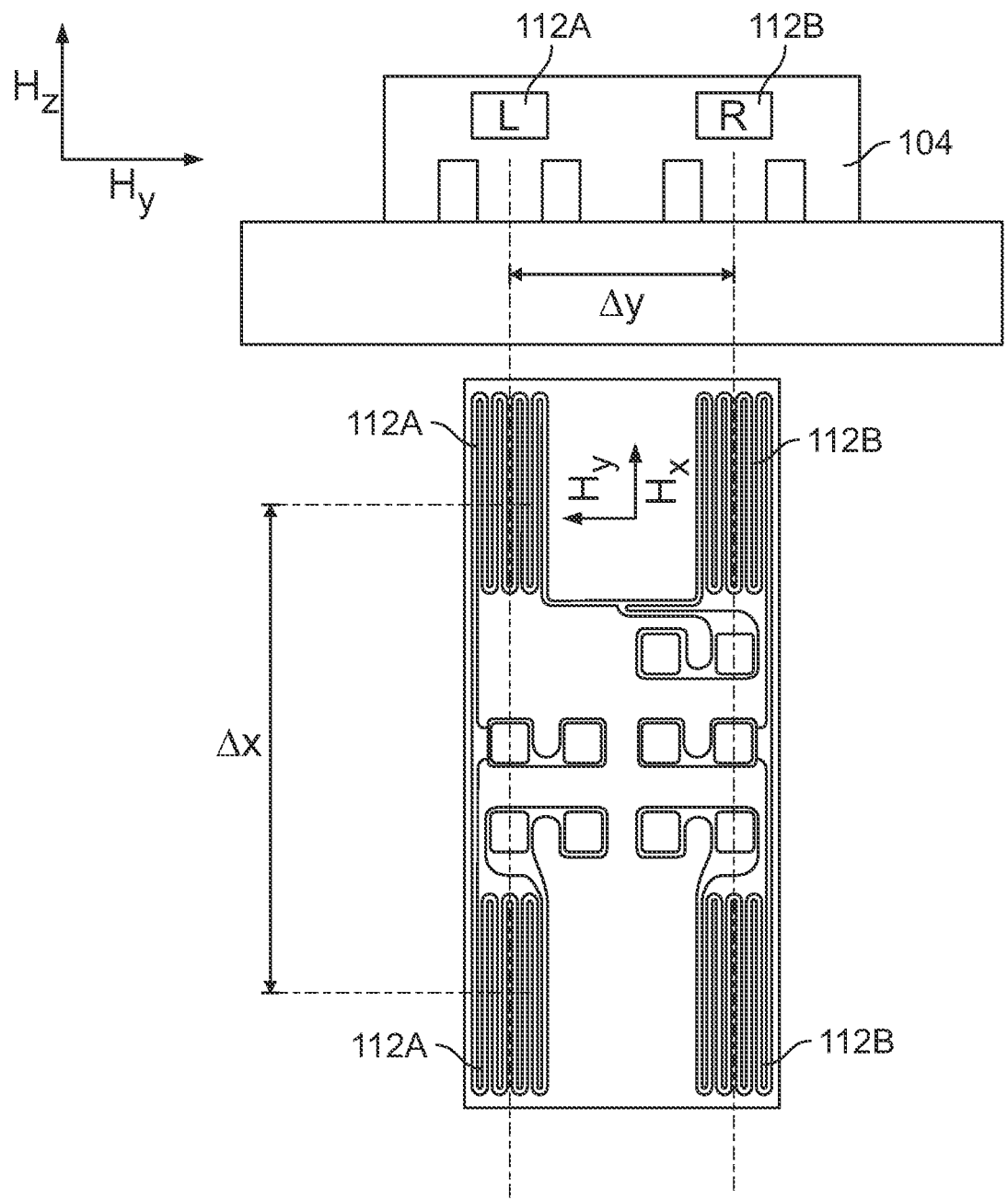
FIG. 3 is a schematic diagram of a two channel magnetic gradient sensor.

Furthermore, FIG. 3 illustrates another aspect of the magnetic gradient sensor shown in FIG. 1. In FIG. 3 the top view of the magnetic gradient sensor 104 is shown together with the side view according to FIG. 1. The distance between the first and second transducer elements 112A and 112B is denoted by Δy. The distance Δy limits the resolution of the gradient sensor in the scan direction, i.e. the direction 110 in which the banknote 100 moves (see FIG. 1).

In the shown example, there is not only one pair of transducer elements 112A and 112B, but a second pair of transducer elements 122A and 122B. The distance Δx between the transducer elements 112 and 122 determines the minimal lateral resolution between two magnetic features which are arranged along the x-direction. The output signals of the two pairs of transducer elements 112, 122 form channels, with each channel containing the information about a particular region in the x-direction.

Figure 5:
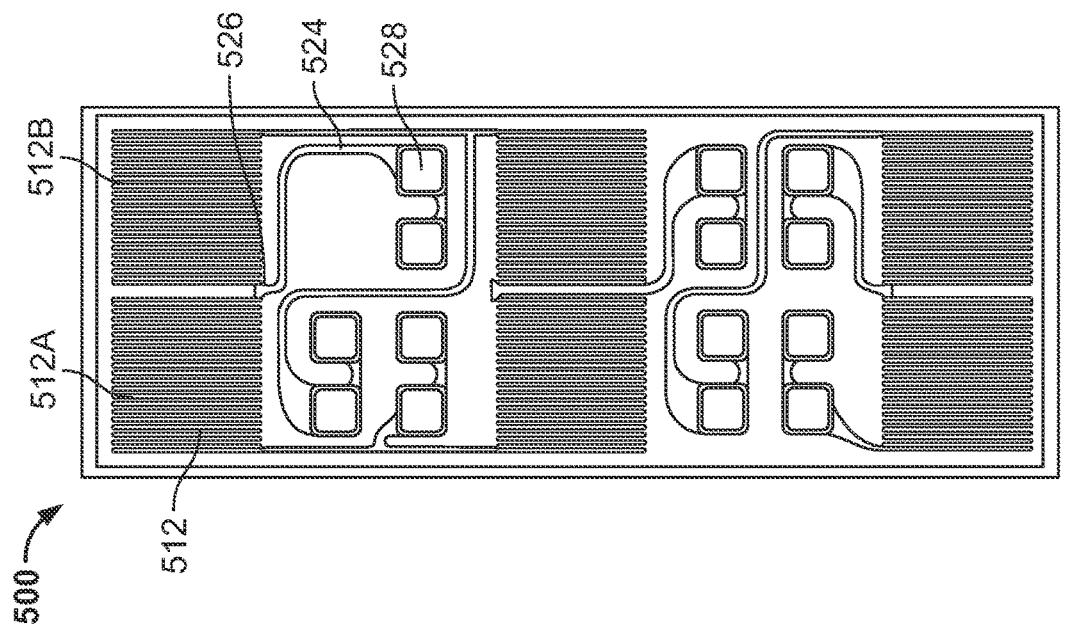
FIG. 5 is a schematic diagram of a conventional three channel magnetic field sensor.
Figure 4:
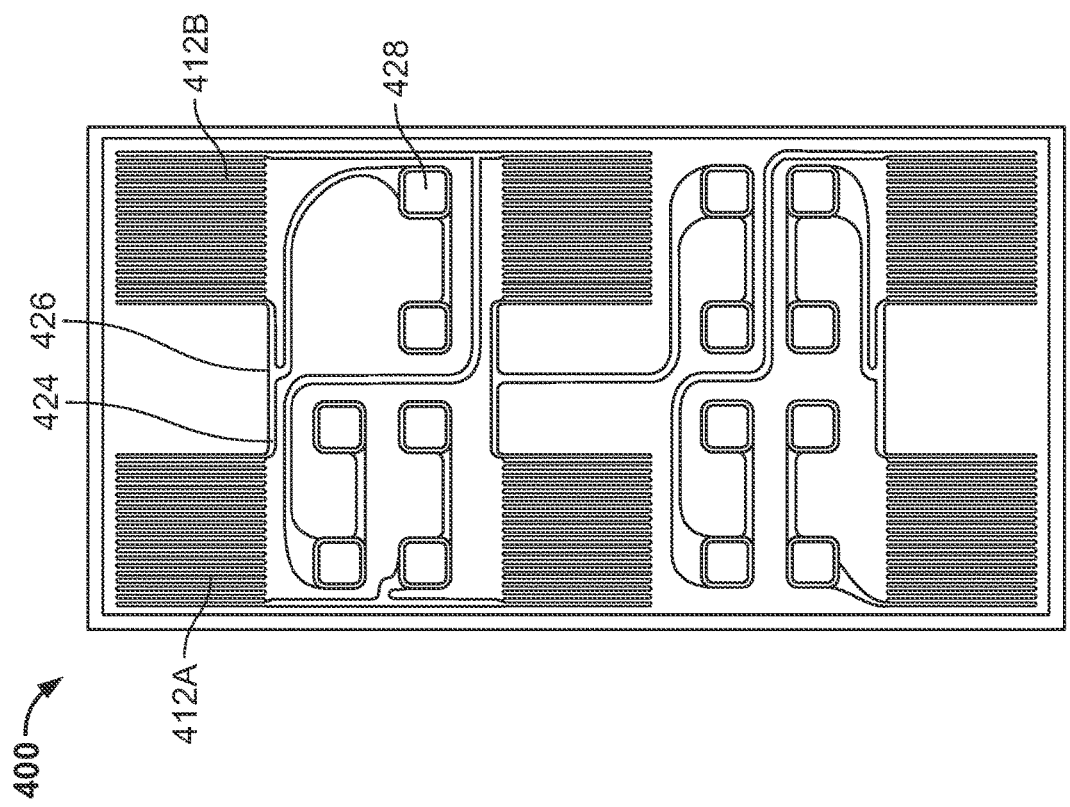
FIG. 4 is a schematic diagram of a conventional three channel magnetic gradient sensor.

The amount of channels is not limited to one or two, also three channels or more are possible. FIGS. 4 and 5 illustrate examples of three-channel magnetic sensors. In particular, FIG. 4 shows a three-channel magnetic gradient sensor 400. The magnetic gradient sensor 400 comprises three pairs of transducer elements 412A, 412B. Each pair of transducer elements 412A, 412 B is connected in series by means of electrically conductive leads 424. At the connecting line between the first and second transducer elements 412A, 412B a central node 426 is connected to contact pads 428. Via the contact pads 428, the central node 426 may be connected to signal processing components (not shown). In particular, the differential signal is generated for each pair of transducer elements as explained above with reference to FIG. 1.

FIG. 5 illustrates a three-channel magnetic field sensor 500 according to the principle explained with reference to FIG. 2. It is noted that the transducer element 512 may be formed as a pair of magnetoresistive elements 512A, 512B. These magnetoresistive elements 512A, 512B are arranged directly adjacent to each other, so that they essentially experience the same magnetic flux at any given time. Unlike in FIG. 4, wherein both resistors 412A and 412B react in the same way to an external field, resistors 512A and 512B are designed to react to a homogeneous field with opposite resistance changes, so that a homogeneous magnetic field across both resistors in this case causes a strong output signal from the voltage divider arrangement.

When using AMR magnetoresistive elements, such opposing reaction of the two resistors can be achieved by providing a different tilting direction of the barber poles arranged on the nickel iron strips. In case of GMR and TMR elements, different pinning directions of the pinned layers are used.

With respect to signal evaluation, the magnetoresistive elements 512A, 512B may also be treated as a half-bridge (or voltage divider). At the connecting line between the first and second transducer elements 512A, 512B a central node 526 is connected via electrically conductive leads 534 to contact pads 528. Via the contact pads 528, the central node 526 may be connected to signal processing components (not shown).

The arrangements shown in FIGS. 4 and 5, however, have the drawbacks explained above and inherent to using separate chips for measuring either the magnetic gradient or the magnetic field. In contrast thereto, with reference to FIGS. 6 and 7 an improved magnetometer 600 according to the present invention will be explained.

Figure 6:
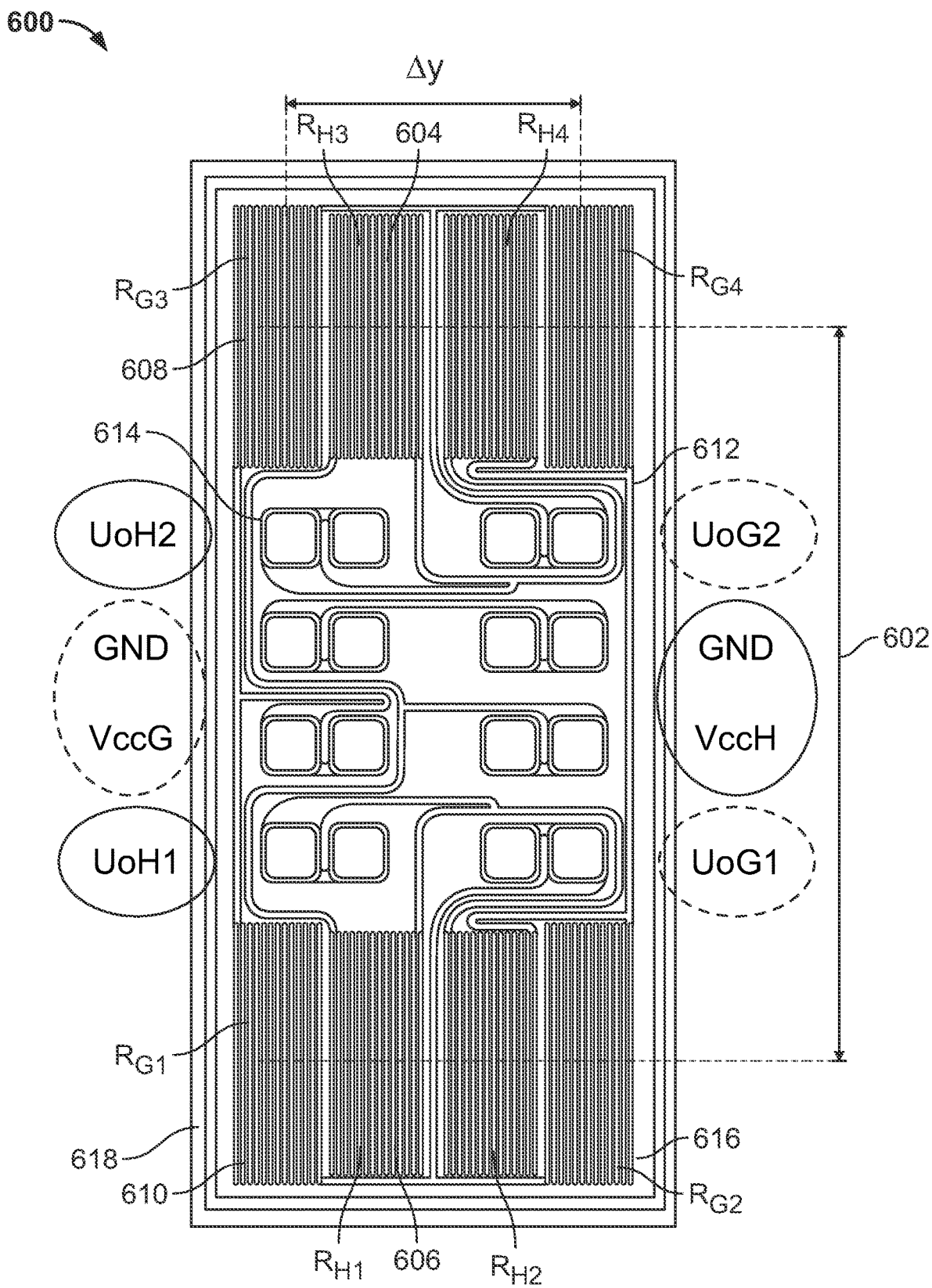
FIG. 6 is a schematic diagram of an integrated magnetometer according to the present disclosure.
Figure 7:
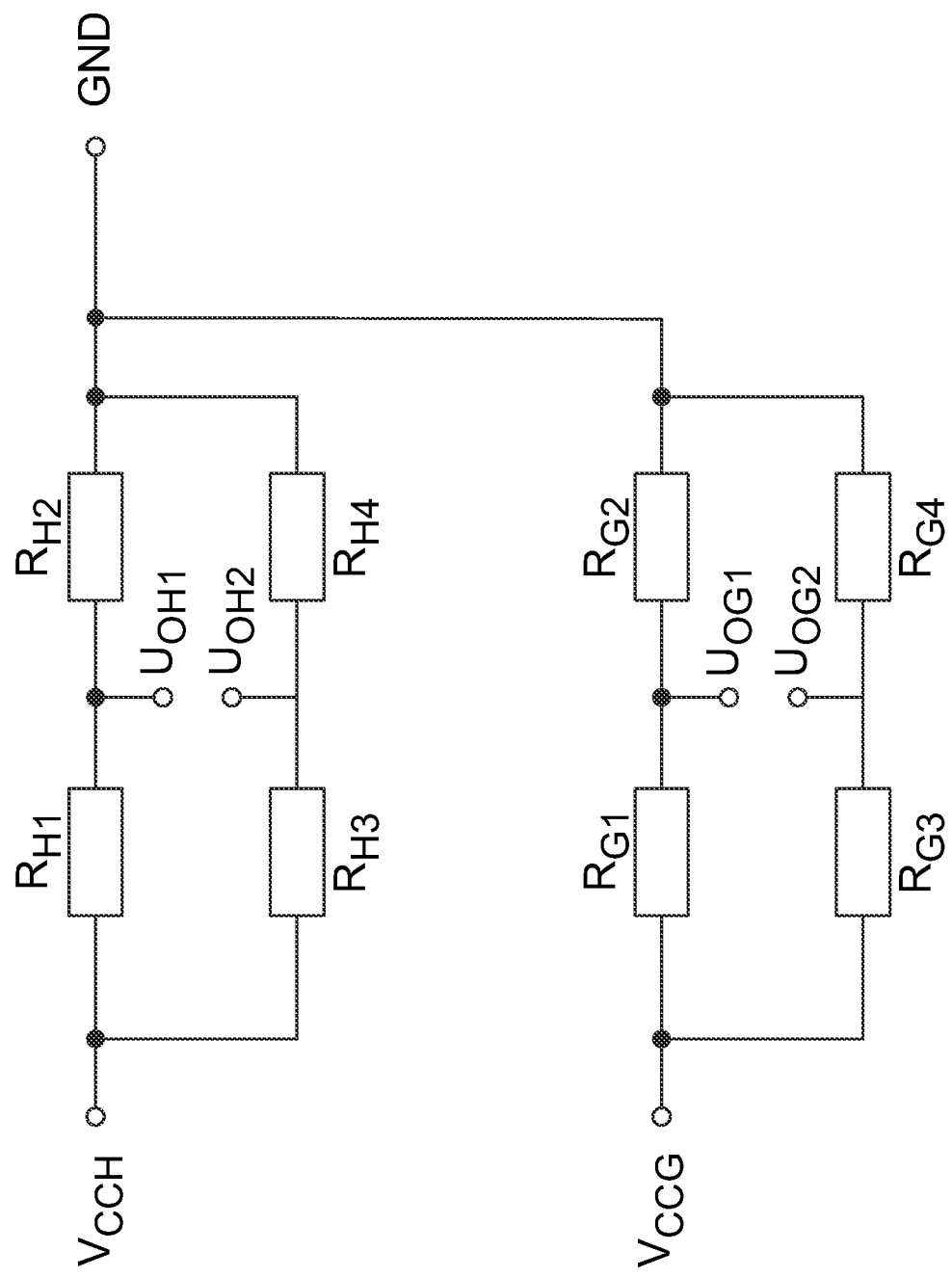
FIG. 7 is a circuit diagram of the integrated magnetometer shown in FIG. 6.

FIG. 6 illustrates the layout of an integrated magnetometer 600 according to the present invention, combining the advantages of magnetic gradient sensing and magnetic field sensing on one integrated chip with a common substrate, and overcoming the problems of known magnetic sensors. FIG. 7 shows the corresponding equivalent circuit diagram of the integrated magnetometer 600.

The integrated magnetometer 600 is designed for detecting a two channel magnetic feature with the two separate parts of the feature being distanced apart by a channel distance 602. The channel distance 602 may for instance be 1.75 mm. The integrated magnetometer 600 comprises, for each of the two channels, a magnetic field sensor 604, 606, which comprises as transducer elements two magnetoresistive elements $R_{H1}$, $R_{H2}$ and $R_{H3}$, $R_{H4}$, respectively. The two magnetoresistive elements $R_{H1}$, $R_{H2}$ of the first magnetic field sensor 604 are arranged closely adjacent to each other, and the two magnetoresistive elements $R_{H3}$, $R_{H4}$ of the second magnetic field sensor 606 are arranged closely adjacent to each other. Thus, the magnetoresistive elements of each magnetic field sensor experience essentially the same magnetic flux to be measured. The voltage measured at the terminal $U_{oH1}$ can be evaluated for generating a first output signal indicative of the absolute value of the magnetic field strength.

Furthermore, the integrated magnetometer 600 comprises, for each of the two channels, a magnetic gradient sensor 608, 610, which comprises two magnetoresistive elements $R_{G1}$, $R_{G2}$ and $R_{G3}$, $R_{G4}$, respectively. The two magnetoresistive elements $R_{G1}$, $R_{G2}$ of the first magnetic gradient sensor 608 are arranged distanced apart from each other by a distance $\Delta y$, and the two magnetoresistive elements $R_{G3}$, $R_{G4}$ of the second magnetic field sensor 610 are also arranged distanced apart from each other by the distance $\Delta y$. Thus, the magnetoresistive elements of each magnetic gradient sensor work as a gradient sensor as explained above referring to FIG. 1.

The voltage measured at the terminal $U_{oG1}$ can be evaluated for generating a second output signal indicative of the gradient of the magnetic field strength. Advantageously, when forming a differential output signal, this output signal using the magnetoresistive elements $R_{G1}$, $R_{G2}$ and $R_{G3}$, $R_{G4}$, respectively, is not impaired by the presence of disturbing external magnetic fields. The strong first output signals of the magnetic field sensors 604, 606 may also be corrected taking into account the differential output signal of the gradient sensors 608, 610.

According to the present disclosure, all transducer elements, the interconnecting electrically conductive leads 612 and the contact pads 614 are integrated on one common substrate 616 an are covered by a common protective layer and/or housing 618. In other words, the integrated magnetometer 600 combines a gradient sensor and a field sensor on one sensor chip.

In order to meet various demands regarding the channel width and number, by combining channels also channel widths being an integer multiple of the channel distance can be realized. In the simplest case, the output signals of neighboring channels can be mixed by directly connecting them. However, individual half bridge signals or paired differential signals analog to a complete Wheatstone bridge may also be generated.

In practice, larger channel widths and a smaller number of channels distributed over the length of the entire sensor array are often used to simplify evaluation. In such cases, the individual outputs of one or more integrated magnetometers can be connected directly to each other. Alternatively, two separate groups of channels, each using one or more connected channel outputs, with opposite signal polarity can be used to generate a differential signal. In order to obtain the same or opposite signal polarities required for this purpose, one can either select the direction of the auxiliary magnetic fields required for the operation of MR sensors accordingly or also operate adjacent integrated magnetometers with the same or opposite supply voltages.

This solution allows the measurement of a high-resolution field signal and a gradient signal whose integral provides a reconstructed field signal with lower resolution but without interference. The advantages of both operating modes can thus be used together without disadvantages.

Furthermore, as can be seen from FIG. 6, the pin assignment of the sensor housing has been selected so that when using only one operating mode, it is possible to choose between the operating modes by soldering the terminals to a PCB rotated 180°. In particular, the terminals belonging to the field sensors (UoH2, UoH1, GND, and VccH), which are encircled by solid lines, are arranged in a pattern corresponding to the terminals belonging to the gradient sensors (UoG2, UoG1, GND, and VccG), which are encircled with broken lines in FIG. 6. The substrate 616 may comprise further electronic elements, such as protection components, for example, ESD protection diodes, pre-amplifiers, and/or digitizer circuitry. According to the present disclosure, at least three magnetoresistive transducer elements are arranged in a way that both a high-resolution field signal and a robust gradient field signal is obtained, whose integral provides a reconstructed field signal with lower resolution but without interference. Moreover, a comparison of both signals gives information on the quality of the measurement.

The above-described concept enables optimized signal quality and information retrieval. The integration of a field sensor with a gradient sensor does not increase the space requirement as compared to the gradient sensor taken alone. No different sensor types are required for field and gradient measurement. This simplifies and reduces the cost of sensor production, warehousing, and logistics. The pin assignment of this surface-mount technology (SMT) package allows changing the operating mode without PCB modification. This simplifies the adaptation of sensor modules to customer requirements and increases the flexibility in development as well as in production. The inventive concept is in particular suitable for magnetoresistive transducer elements, AMR or TMR transducers.

The operation of the exemplary integrated magnetometer 600 will be explained in more detail with respect to FIGS. 8 and 9.

Figure 8:
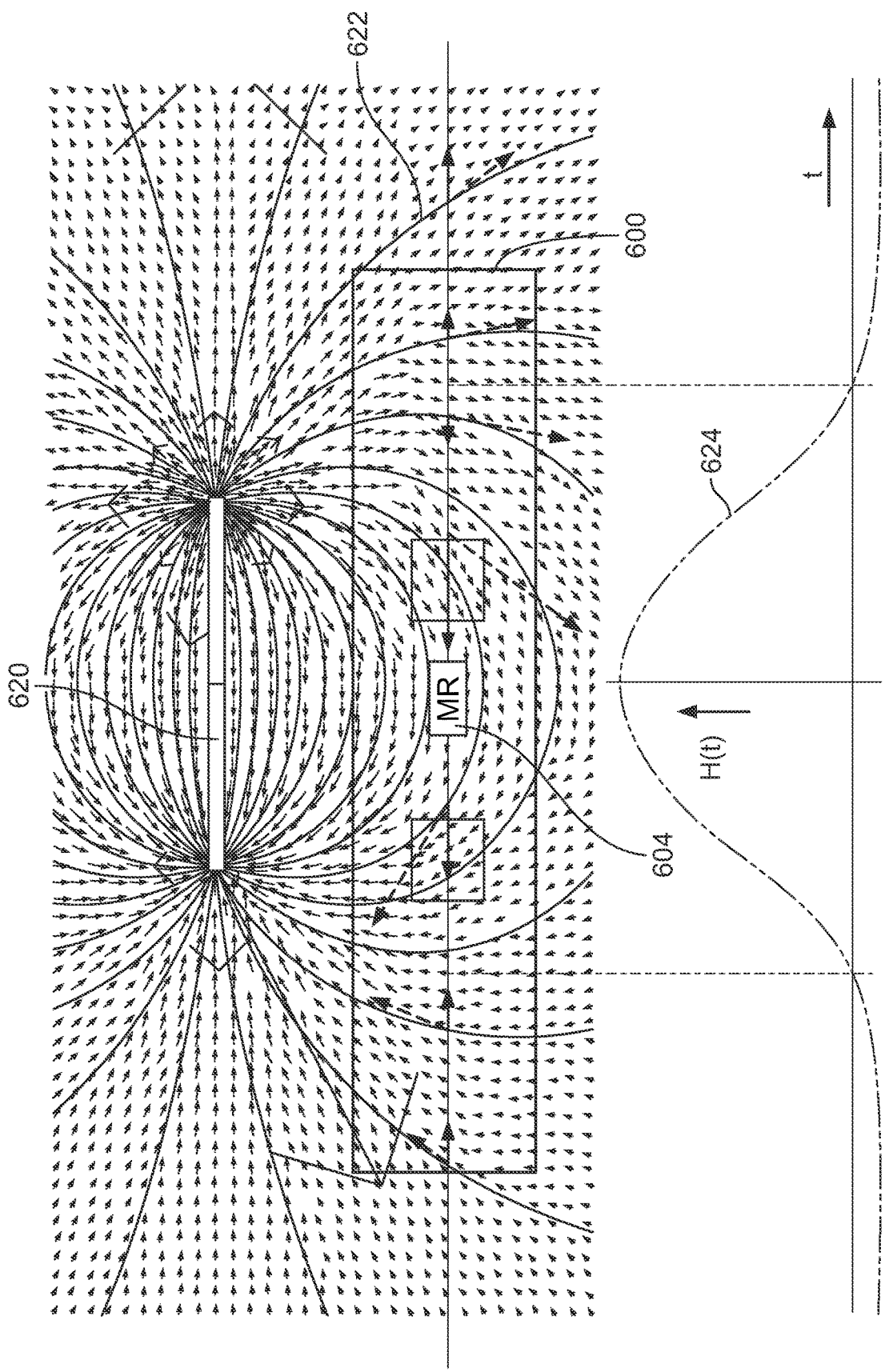
FIG. 8 is a schematic diagram illustrating the field sensing operational mode of the magnetometer shown in FIG. 6.

FIG. 8 shows the operational mode where only the magnetoresistive field sensors 604, 606 (only one sensor is visible in the cross-sectional view of FIG. 8) are measuring the magnetic field of a moving magnetic source 620. Schematically, the magnetic flux lines 622 are shown with the tangential components (broken arrows) and the component along the sensitive plane of the magnetoresistive transducer element (i.e. along the y-direction, solid arrows).

As with the arrangement shown in FIG. 2, the maximum signal can be measured when the magnetic flux lines 622 are parallel to the sensitive plane of the magnetic field sensor 604, 606. The curve H(t) 624 has an H value of zero, when the magnetic flux lines are orthogonal to the sensitive plane of the magnetic field sensor 604.

Figure 9:
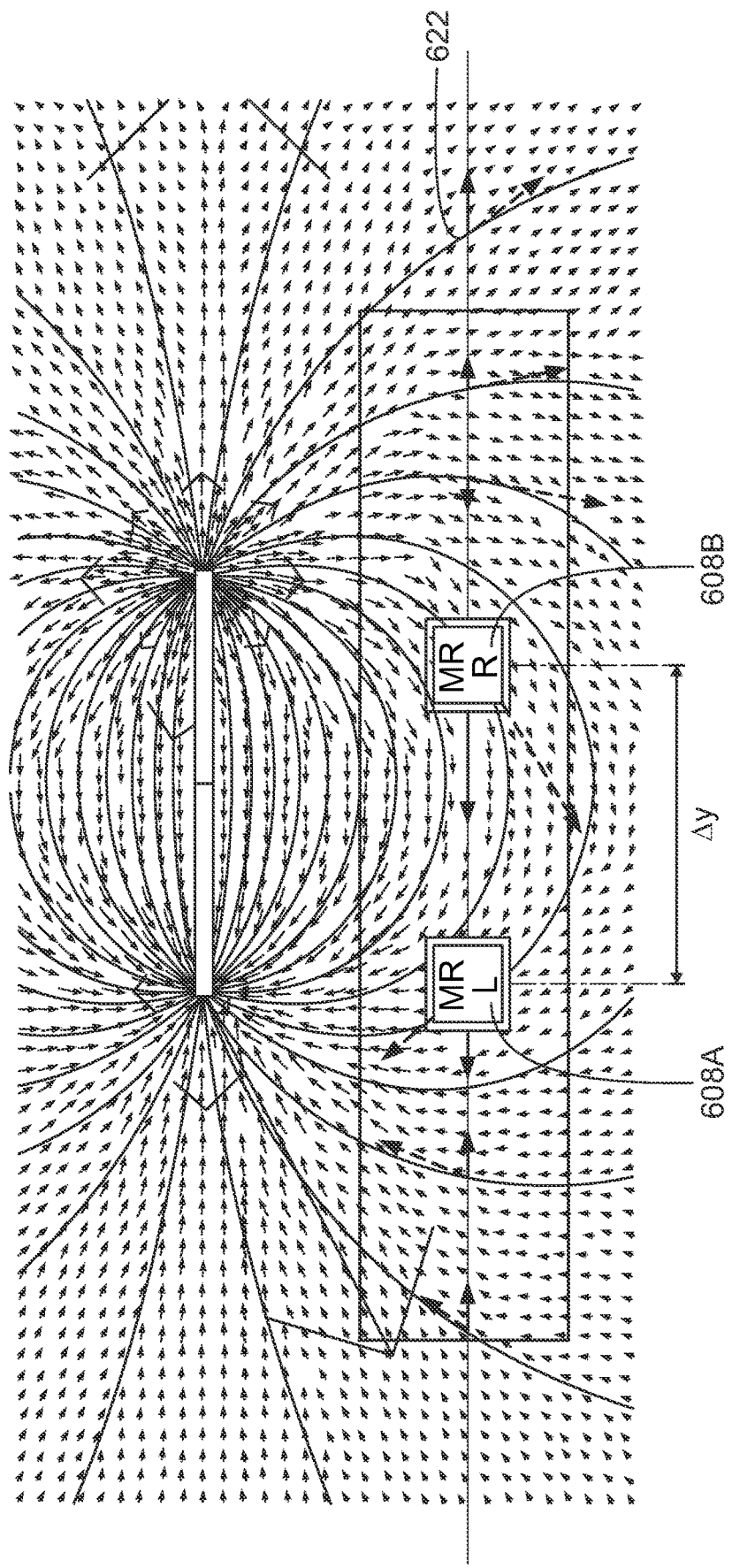
FIG. 9 is a schematic diagram illustrating the gradient sensing operational mode of the magnetometer shown in FIG. 6.

As shown in FIG. 9, the magnetic gradient sensor 608 has two magnetoresistive transducer elements 608A, 608B, which are distanced or spaced apart by a distance Δy in scan direction. The gradient measurement yields an output signal which is the difference of the voltage measured across the magnetoresistive element 608B and the voltage measured across the other magnetoresistive element 608A. The magnetoresistive transducer elements 608A, 608B thus measure the local difference of the magnetic field distribution. The distance Δy determines the resolution in the scan direction and may for instance be 0.75 mm.

According to the above-described embodiments, the present disclosure provides a device for the detection of ferro- or superparamagnetic structures on material surfaces using magnetic field sensitive sensor elements. These magnetic field sensitive sensor elements are assembled on a common carrier substrate. A spatially small sensor element array is responsive to homogeneous magnetic fields which generates a sensor signal which is initially approximatively proportional to a component of the magnetic field generated by the field generating structures. A second sensor element arrangement reacts to field differences between two respectively spatially small but spaced apart sensor elements. The sensor element arrangement responding to homogeneous fields is arranged in the space between the two sensor elements which form the sensor arrangement sensitive to local field differences. Specifically, the sensor elements each may comprise two resistors connected to a voltage divider arrangement and a magnetoresistive effect is used for signal generation. Further, separate supply voltage terminals may be provided for the sensor element arrays responsive to homogeneous fields and local field differences. An exemplary terminal assignment of the sensor package may be provided, which allows a change between a measurement of local field differences and a measurement of homogeneous fields by means of a 180° rotated placement on a carrier plate.

It should be appreciated by those skilled in this art that the above embodiments are intended to be illustrative, and many modifications may be made to the above embodiments by those skilled in this art, and various structures described in various embodiments may be freely combined with each other without conflicting in configuration or principle.

Although the present disclosure have been described hereinbefore in detail with reference to the attached drawings, it should be appreciated that the disclosed embodiments in the attached drawings are intended to illustrate the preferred embodiments of the present disclosure by way of example, and should not be construed as limitation to the present disclosure.

Although several exemplary embodiments have been shown and described, it would be appreciated by those skilled in the art that various changes or modifications may be made to these embodiments without departing from the principles and spirit of the invention, the scope of which is defined by the claims and their equivalents.

It should be noted that, the word "comprise" doesn't exclude other elements or steps, and the word "a" or "an" doesn't exclude more than one. In addition, any reference numerals in the claims should not be interpreted as the limitation to the scope of the present disclosure.

What is claimed is:

1. An integrated magnetometer comprising:
at least one field sensor unit including a first transducer element for generating, in response to a detected magnetic field, a first electrical output signal;
at least one gradient sensor unit including at least a pair of second transducer elements which are arranged to detect the magnetic field at two different locations and adapted to generate, in response to the detected magnetic field, a second electrical output signal, the first and second transducer elements formed on a common substrate; and
a plurality of terminals for connecting the integrated magnetometer to external components, first terminals are connected to the at least one field sensor unit and second terminals are connected to the at least one gradient sensor unit, the first terminals are arranged in a pattern corresponding to a pattern of the second terminals rotated 180 degrees around a central axis of the substrate.

2. The integrated magnetometer according to claim 1, wherein the first and second transducer elements are encompassed by a common protective layer and/or housing.

3. The integrated magnetometer according to claim 2, wherein the first transducer element and/or the pair of second transducer elements include at least one magnetoresistive element.

4. The integrated magnetometer according to claim 3, wherein the first transducer element is arranged between the pair of second transducer elements in a scan direction of the magnetometer, the first and second transducer elements being aligned in the scan direction to form a first transducer group.

5. The integrated magnetometer according to claim 4, wherein at least one further transducer group is arranged on the common substrate.

6. The integrated magnetometer according to claim 2, wherein the housing is a surface mounted technology compatible housing.

7. The integrated magnetometer according to claim 2, wherein the substrate further includes electronic components for protecting the sensor and/or electronic components for performing signal processing.

8. The integrated magnetometer according to claim 1, wherein the first transducer element includes two magnetoresistive elements which are positioned adjacent to each other and which are electrically connected to form a half bridge.

9. The integrated magnetometer according to claim 1, wherein the two second transducer elements of the at least one gradient sensor unit include one magnetoresistive element each, which are positioned distanced from each other and are electrically connected to form a half bridge.

10. A magnetometer comprising:
a substrate;
at least one field sensor unit including a first transducer element formed on the substrate for generating, in response to a detected magnetic field, a first electrical output signal, and at least one gradient sensor unit including a pair of second transducer elements formed on the substrate and arranged to detect the magnetic field at two different locations and adapted to generate, in response to the detected magnetic field, a second electrical output signal, the first transducer element arranged between the pair of second transducer elements in a scan direction of the magnetometer, the first and second transducer elements being aligned in the scan direction to form a first transducer group.

11. The magnetometer according to claim 10, wherein the first transducer element is arranged directly between the pair of second transducer elements, the first transducer element and the pair of second transducer elements each centered along an axis extending in the scan direction.

12. The magnetometer according to claim 10, wherein a second one of the at least one field sensor includes a second first transducer element, and a second one of the at least one gradient sensor unit includes a second pair of second transducers, the second field sensor and the second gradient sensor form a second transducer group spaced apart from the first transducer group in a direction perpendicular to the scan direction, the first and second transduced groups measuring a respective one of a plurality of signal channels.

13. The magnetometer according to claim 10, wherein the entire first transducer element is arranged directly between the pair of second transducer elements.

14. A method of detecting a magnetic field using an integrated magnetometer having a field sensor unit and a gradient sensor unit comprising the steps of:
with the field sensor unit including a first transducer element formed on a substrate, measuring a magnetic field strength at a first position of the integrated magnetometer and generating an absolute output signal;
with the gradient sensor unit including a pair of second transducer elements formed on the substrate with the first transducer element arranged between and aligned with the pair of second transducer elements in a scan direction of the magnetometer, measuring the magnetic field strength at a second and a third position of the integrated magnetometer and calculating a differential signal; and
evaluating the absolute output signal and the differential signal to generate a combined output signal.

15. The method according to claim 14, wherein the step of measuring the magnetic field strength at the first position and the step of measuring the magnetic field strength at the second and the third position are performed simultaneously.

16. The method according to claim 14, wherein the magnetic field to be detected is movable with respect to the integrated magnetometer.

17. The method according to claim 14, further comprising the step of generating a quality signal indicative of the quality of the measurement by comparing the absolute output signal and the differential signal.

18. The method according to claim 14, wherein the combined output signal is a reconstructed field signal which is corrected by cancelling interferences.

19. The method according to claim 14, wherein the magnetic field to be detected is generated by a magnetic safety feature of a document.

20. The method according to claim 14, wherein a plurality of groups formed by first and second transducer elements of the integrated magnetometer is used to measure a plurality of signal channels.

* * * * *